United States Patent [19]

Surlekar

[11] Patent Number: 5,668,764

[45] Date of Patent: Sep. 16, 1997

[54] TESTABILITY APPARATUS AND METHOD FOR FASTER DATA ACCESS AND SILICON DIE SIZE REDUCTION

[75] Inventor: Vipul A. Surlekar, Bombay, India

[73] Assignee: Texas Instruments Incorporated, Dallas, Tex.

[21] Appl. No.: 408,515

[22] Filed: Mar. 22, 1995

[51] Int. Cl.$^6$ ........................................... G11C 7/00
[52] U.S. Cl. ................... 365/201; 365/189.07; 371/21.1; 371/21.2
[58] Field of Search ...................... 365/200, 201, 365/189.01, 189.07; 371/21.1, 21.2

[56] References Cited

FOREIGN PATENT DOCUMENTS

| 58-109943 | 6/1983 | Japan . |
| 5-250873 | 9/1993 | Japan . |
| 5-297067 | 11/1993 | Japan . |

*Primary Examiner*—Viet Q. Nguyen
*Attorney, Agent, or Firm*—William W. Holloway; W. James Brady, III; Richard L. Donaldson

[57] ABSTRACT

In order to minimize the time consuming testing of large (e.g., 4 mega-bit) memory units, the units can be designed with alternate test mechanisms incorporated therein. The design for testability (DFT) techniques used in dynamic random access memories to reduce the time required testing use parallel read/write procedures and similar techniques. The technique of the present invention compares actual data signal output with an expected data signal in parallel resulting in a faster determination of the memory status. The additional apparatus is incorporated in the memory unit in the vicinity of the group of storage cells under test. By appropriate selection of the location and function of the apparatus, the test apparatus can result in a smaller chip size, faster processing operation, and lower power consumption. The DFT technique reduces the time for testing by incorporating parallel read/write procedures along with additional test procedures. Little additional apparatus is required for the implementation of the improved test procedures. The benefit derived from the improved testing techniques exceeds the relatively modest implementation cost.

25 Claims, 5 Drawing Sheets

TESTABILITY APPARATUS AND METHOD FOR FASTER DATA ACCESS AND SILICON DIE SIZE REDUCTION

FIELD OF THE INVENTION

The present invention relates generally to the testing of semiconductor memory chips and, more particularly, to the testing of memory chips having a large number of memory locations, the number being so large that verification of the operation of production quantity units would require an excessive amount of time.

DESCRIPTION OF THE RELATED ART

Referring to FIG. 1, a block diagram of a semiconductor memory unit of the type for which the present invention can be advantageously used is shown. In the memory unit, ADDRESS SIGNALs are applied to row address buffers 11 and to column address buffers 12. The ADDRESS SIGNALs stored in the row address buffers 11 are applied to the row decode unit 13 and to the timing and control unit 19, while the ADDRESS SIGNALs stored in the column address buffers are applied to the column decode unit 14 and to the data input/output buffers 16. The signals from the row decode unit 13 and the column decode unit 14 are applied to the memory array 15, the signals applied to the memory array 15 specifying a group of memory array cells to be manipulated in response to control signals. Control signals are applied to the timing and control circuit 19. The control signals include the ROW ADDRESS STROBE_(RAS_), the COLUMN ADDRESS STROBE_(CAS_), the WRITE ENABLE_ (W_), and the OUTPUT ENABLE_ (G_). (The convention being used herein is that the _ symbol following a signal name indicates the logical complement of the signal.) Output signals from the timing and control unit 19 are applied to the data input/output buffers 16. The memory array unit 15 applies signals to, and receives signals from, the data input/output buffers 16. The data input/output buffers 16 receive signals from the data in register 18 and applies signals to the data out register 17. DATA SIGNALs are applied to the data in register and are received from the data out register 17.

Referring to FIG. 2A, the memory array 15 of the preferred embodiment is organized into four quadrants, each quadrant including eight blocks 21 of storage cells. Referring to FIG. 2B, each block of storage cells has 256 rows and 512 columns of storage cells. The x's in FIG. 2A illustrate the implementation in which each access (or address) to the storage cell array actually designates a group of storage cells rather than a single storage cell.

The operation of the memory unit illustrated in FIG. 1, FIG. 2A and FIG. 2B can be understood as follows. The memory unit 15 array is arranged as shown in FIG. 2A and FIG. 2B. In the preferred embodiment, the storage cells are implemented with trench capacitors and with pass transistors. In each memory access cycle, 8 cells are simultaneously accessed by the coincidence of row select (defined by A0–A7), array select (A8–A9) and column select (A0–AS) signals, when the DRAM unit is arranged in a 512K×8 bits configuration.

The timing and control unit 19 provides the internal timing signals for the decoding, the read/write strobing, the data signal gating, and the output signal gating. The timing circuits are activated by the negative going edges of (TTL) RAS_ clock signals and the CAS_ clock signals.

Access of the stored data from the memory unit consists of several discrete retrieval operations. The first of these operations is the selection of the desired rows of storage cells, sensing the data sorted in each of the cells with sense amplifiers, and restoring the sensed data back into the cells. When this operation is complete, the sensed data is available at the output terminals of all of the sense amplifiers. These operations are performed with only the row address signals and the RAS_ clock. The first retrieval sequence also fulfills the refresh requirements for the selected row(s) since data has been restored in all of the cells of the row. The next set of operations consists of applying the output signals from the specified sense amplifiers to the local (first level) input/output (LIO) lines, amplifying this signal, and then transferring data from the intermediate amplifiers to the data (second level) lines. The data lines are then buffered and the output data is applied to the input/output terminals of the memory unit.

Based on an analysis of production test flows, the test times can require several minutes for each (4 mega-bit) DRAM memory unit in the absence of dedicated testing apparatus and techniques. The requirements for providing appropriate testing facilities would be overwhelming for production of projected volumes.

A need has therefore been felt for providing apparatus and procedures which would permit the efficient testing of large memory units. The apparatus includes with additional apparatus, however, the additional apparatus must be competitive with the cost for testing the memory unit in the absence of the additional apparatus.

SUMMARY OF THE INVENTION

The aforementioned and other features of the present invention are provided, according to the present invention, in a memory unit having an array of storage cells which has been divided into groups of storage cells, by performing processing functions and, especially the comparison function, in the vicinity of each group of storage cells which are under test. The testing procedure involves the storage of a selected logic signal, referred to as the expected data signal, in each addressable cell, the retrieval of the stored logic signal from each storage cell, and the comparison of the retrieved data signal with the expected data signal (supplied by the user) to verify that the storage into and retrieval from the storage cells provides the signal that was originally stored in the memory unit.

These and other features of the present invention will be understood upon reading of the following description along with the Figures.

BRIEF DESCRIPTION OF THE DRAWINGS

FIG. 2A illustrates the division of the memory cell array into four quadrants, while

DESCRIPTION OF THE PREFERRED EMBODIMENT(S)

1. Detailed Description of the Drawings

Figure 1:
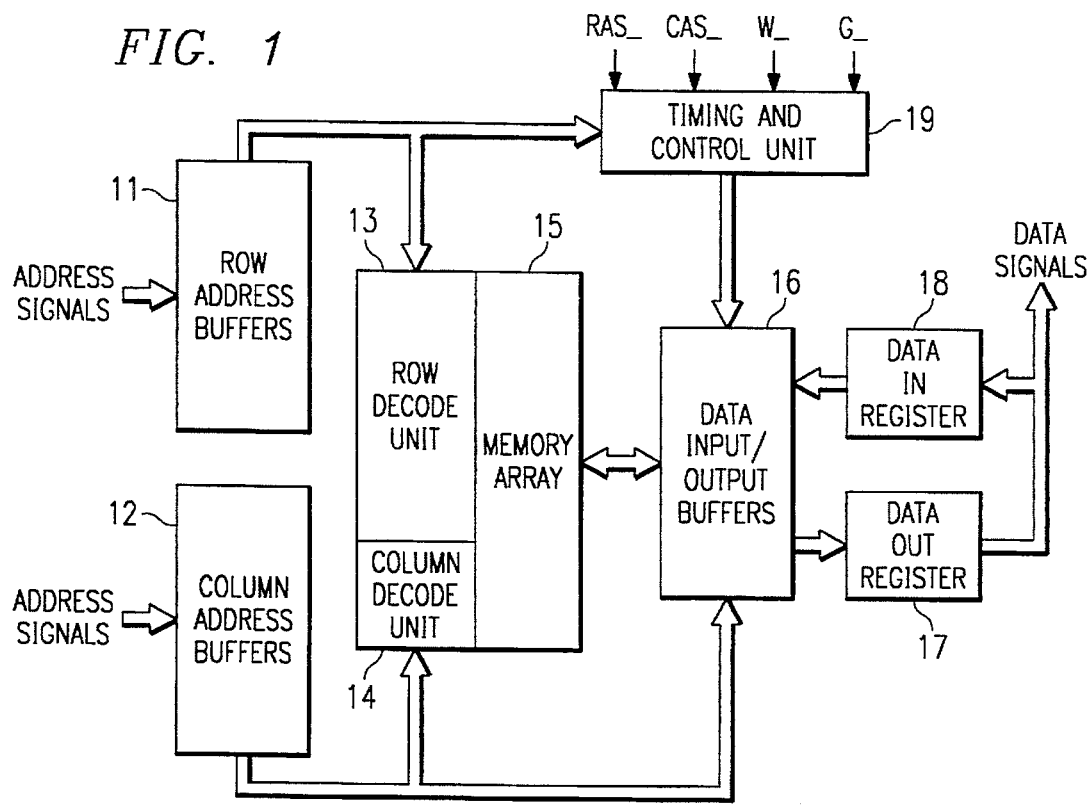
FIG. 1 is a block diagram of a memory unit capable of advantageous use of the present invention.
Figure 2A:
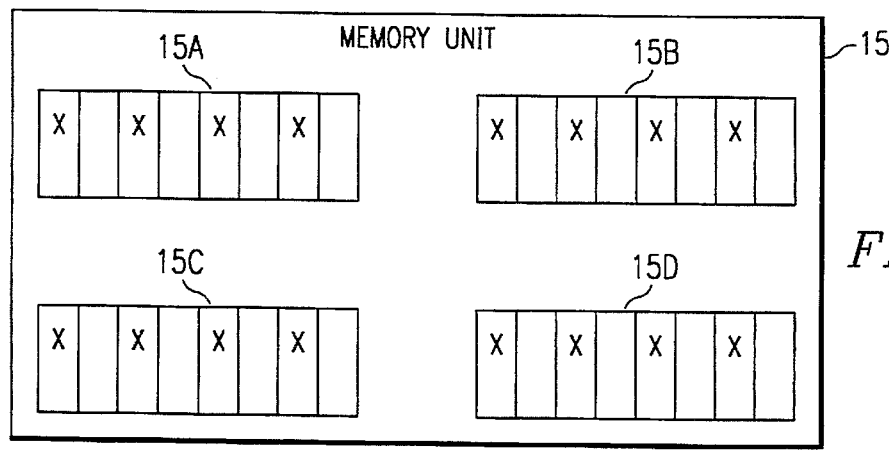
Figure 2B:
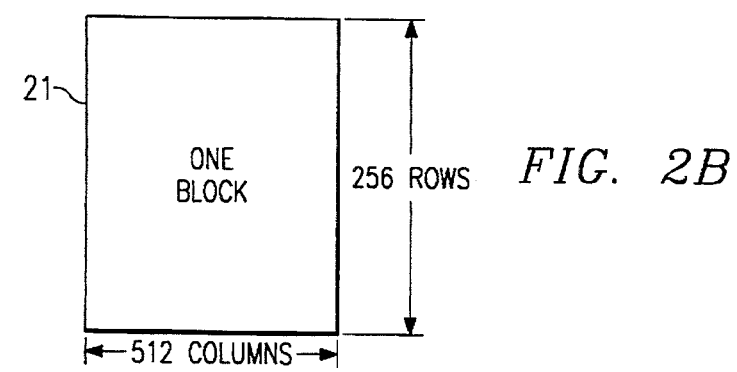
FIG. 2B illustrates the storage cell composition of the memory unit.

FIG. 1, FIG. 2A, and FIG. 2B have been described with relation to the related art.

Figure 3:
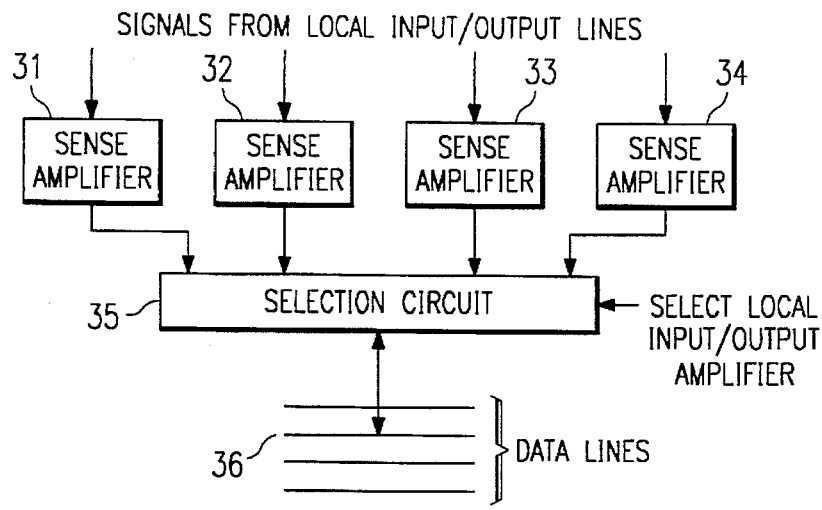
FIG. 3 is a block diagram of the apparatus for retrieval of the data signals from individual cells of the storage array.

Referring to FIG. 3, the selection of one of the addressed storage cells in each quadrant (i.e., shown by the x's in FIG. 2A) is illustrated. Each addressed storage cell is coupled to a sense amplifier 31–34. The output signals from the sense amplifiers 31–34 are applied to selection circuit 35. In response to a SELECT LOCAL INPUT/OUTPUT AMPLIFIER SIGNAL, the DATA SIGNAL from one of the sense amplifiers 31–34 is applied to a predetermined data line 36.

Figure 4:
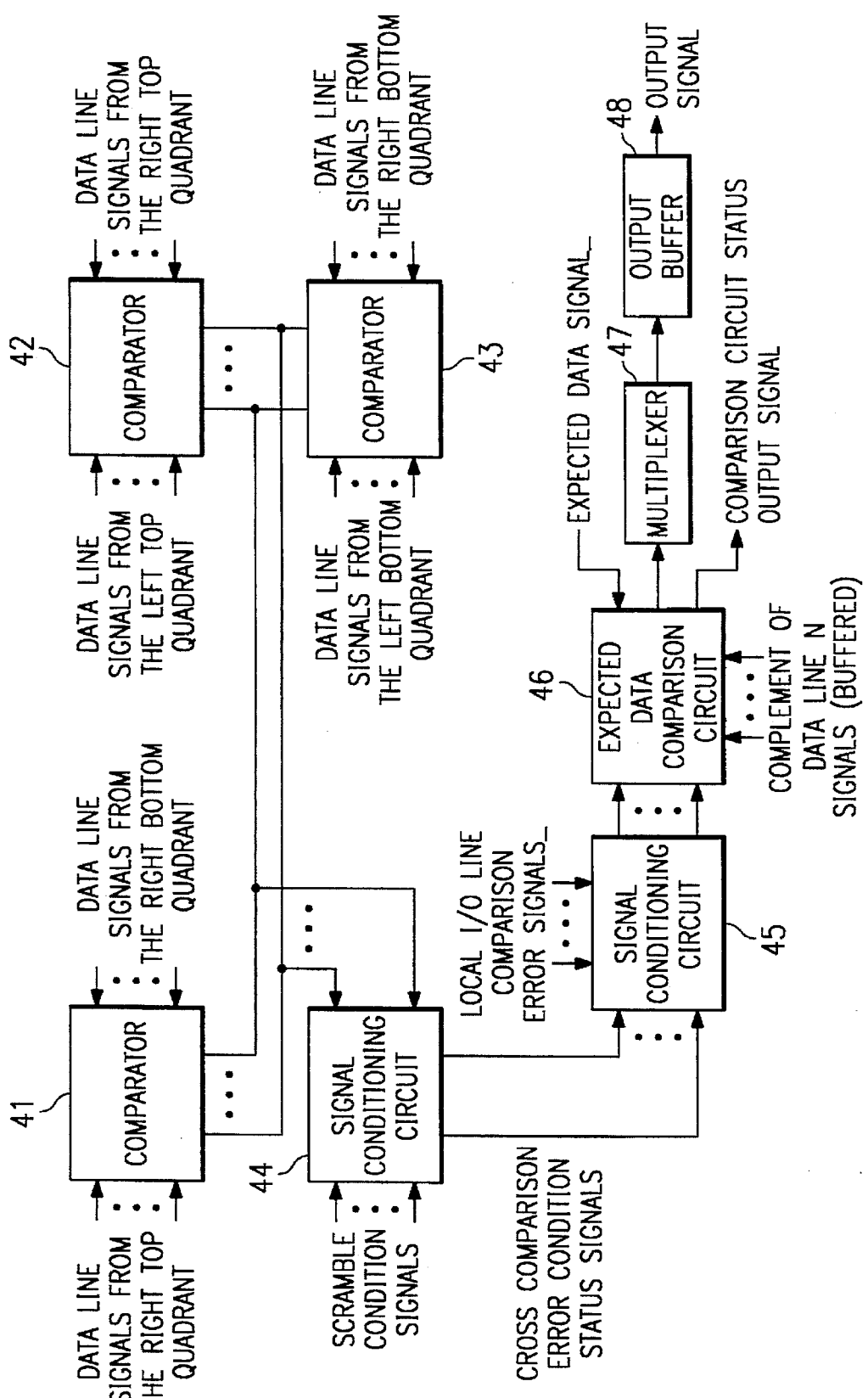
FIG. 4 is a block diagram of one embodiment apparatus for testing the signals retrieved from a storage cell array.

Referring to FIG. 4, a block diagram of the apparatus for the testing a semiconductor memory unit is shown. Comparator 41 compares a group of selected data signals, the DATA LINE SIGNALS FROM THE RIGHT TOP QUADRANT with the DATA LINE SIGNALS FROM THE RIGHT BOTTOM QUADRANT. Comparator 42 compares the DATA LINE SIGNALS FROM THE LEFT TOP QUADRANT with the DATA LINE SIGNALS FROM THE RIGHT TOP QUADRANT. Comparator 43 compares the DATA LINE SIGNALS FROM THE LEFT BOTTOM QUADRANT with the DATA LINE SIGNALS FROM THE RIGHT BOTTOM QUADRANT. The COMPARATOR ERROR STATUS SIGNALS from comparators 41, 42, and 43 are applied to signal conditioning circuit 44. Signal conditioning circuit 44 also has SCRAMBLE CONDITION SIGNALs applied thereto. The output signals from the signal conditioning circuit 44, i.e., CROSS COMPARISON ERROR CONDITION STATUS SIGNALs, are applied to signal conditioning circuit 45. Signal conditioning circuit 45 also receives LOCAL I/O LINE COMPARISON ERROR SIGNALs_. The output signals from the signal conditioning circuit 45 is applied to expected data comparison circuit 46. Expected value comparison circuit 46 also receives the EXPECTED DATA SIGNAL_ and the buffered complement of the DATA LINE N SIGNALs. The output signal of the expected data comparison circuit 46 is applied to multiplexer 47, while the output signal from multiplexer 47 is applied to output buffer 48.

Figure 5:
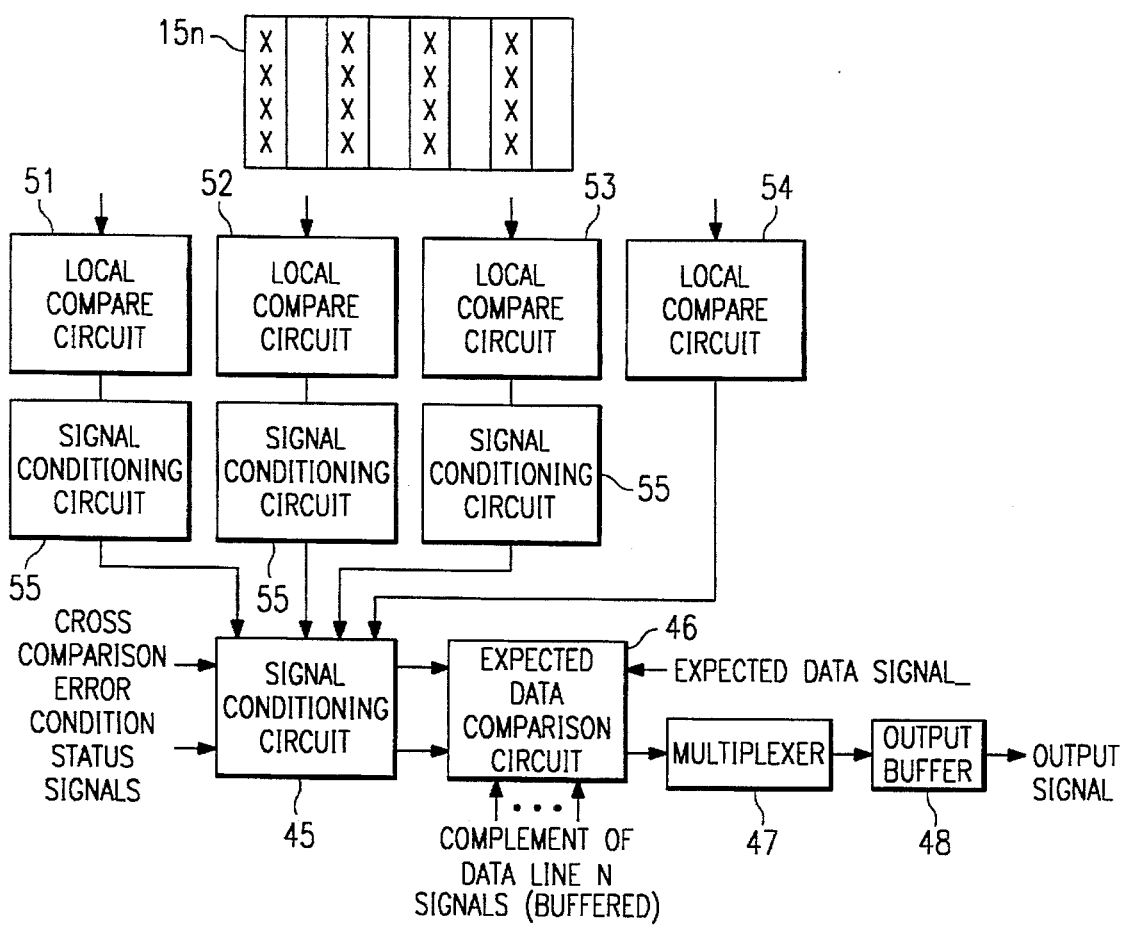
FIG. 5 is a block diagram of another embodiment of apparatus for testing the data signals retrieved from a storage cell array.

Referring to FIG. 5, another embodiment of a memory unit testing apparatus is shown. When the storage cells of a local quadrant 15n is accessed, the data in the accessed storage cells are applied to local compare circuits 51–54. The output signals from the local compare circuits 51–54 are applied to signal conditioning circuit 55 and 45. As in FIG. 4, signal conditioning circuit 45 has the CROSS COMPARISON ERROR CONDITION STATUS SIGNALs applied thereto. The remainder of the apparatus, expected data comparison circuit 46, multiplexer 47, and output buffer 48 are the same as found in FIG. 4.

Figure 6:
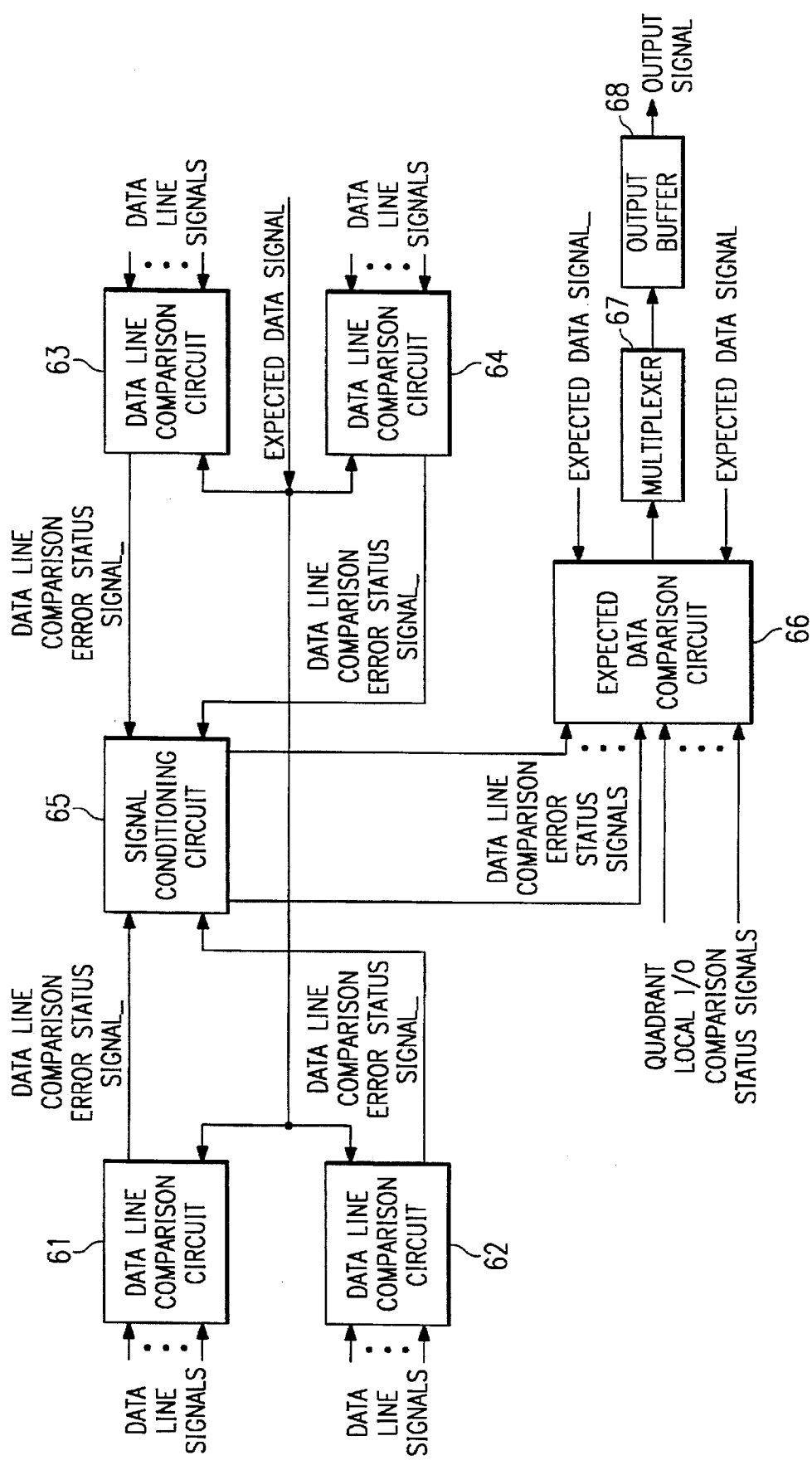
FIG. 6 is a block diagram of the apparatus required to test a 16 times parallel-read semiconductor memory unit according to the present invention.

Referring to FIG. 6, a block diagram of a apparatus for testing a 16-times parallel-read semiconductor memory is shown. A data line comparison circuit (61, 62, 63, and 64) is associated with each quadrant of the semiconductor memory. Each data line comparison circuit (61, 62, 63, and 64) has DATA LINE SIGNALs from the associated quadrant applied thereto. In addition, each data line comparison circuit (61, 62, 63, and 64) has an EXPECTED DATA SIGNAL applied thereto. Each data line comparison circuit applies a DATA LINE COMPARISON ERROR STATUS SIGNAL_ to signal conditioning circuit 65. Signal conditioning circuit 65 applies DATA LINE COMPARISON ERROR STATUS SIGNALs to expected data comparison circuit 66. The expected data comparison circuit 66 also receives the EXPECTED DATA SIGNAL and the EXPECTED DATA SIGNAL_ along with QUADRANT LOCAL I/O COMPARISON STATUS SIGNALs. The output signal from the expected data comparison circuit 66 is applied to multiplexer 67, while the output signal from multiplexer 67 is applied to output buffer 68.

Figure 7:
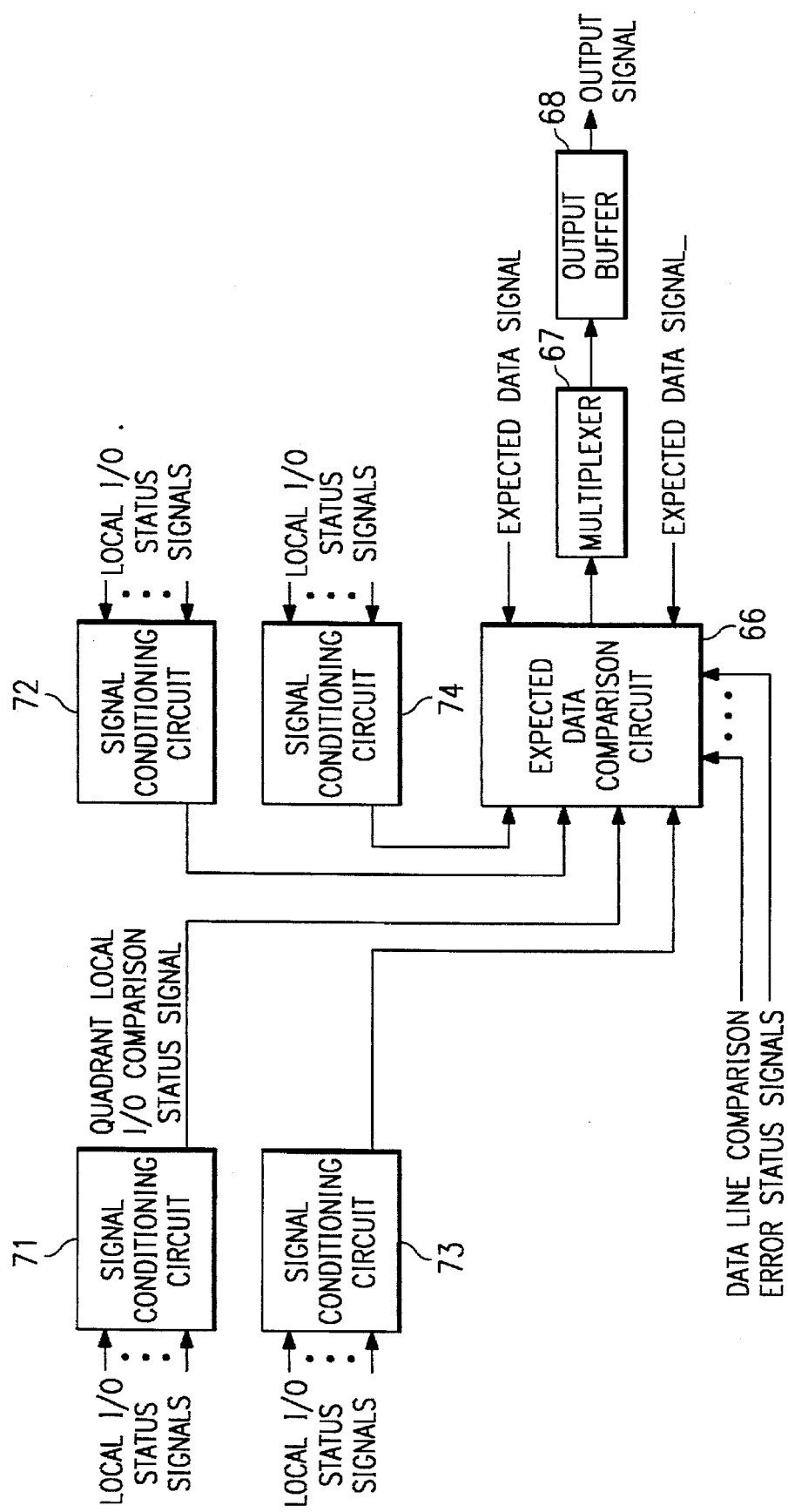
FIG. 7 is a block diagram of the apparatus required to test a 32 times parallel-read semiconductor memory according to the present invention.

Referring to FIG. 7, a block diagram of the apparatus for testing a 32-times parallel-read semiconductor memory is shown. Signal conditioning circuits (71, 72, 73, and 74) receive LOCAL I/O STATUS SIGNALs and generate QUADRANT LOCAL I/O COMPARISON STATUS SIGNALs. The QUADRANT LOCAL I/O COMPARISON STATUS SIGNALs are applied to expected data comparison circuit 66. The expected data comparison circuit 66 also has DATA LINE COMPARISON ERROR STATUS SIGNALs, EXPECTED DATA SIGNAL, and EXPECTED DATA SIGNAL_ applied thereto. The output signal from the expected data comparison circuit 66 is applied to multiplexer 67 and the output signal from multiplexer 67 is applied to output buffer 68.

2. Operation of the Preferred Embodiment(s)

The technique for eliminating the time-consuming test algorithms is to design the memory unit to accommodate alternative test procedures. This technique has the limitation that the effective cost of implementing the alternative test procedures should not exceed the effective saving provided by the alternative test procedure. The design for testability (DFT) procedures provide 1.) test time reduction by doing parallel read/write operations: 2.) allowing control of the some internal signals that cannot be accessed during normal operation; 3.) monitoring key voltages and obtaining redundancy information; and 4.) improving product quality and reliability by incorporating internal stress modes.

In the typical operation of a DRAM memory unit, several bits are retrieved from the storage cell array during a single cycle. During a non-test operation cycle, a sub-set of these bits are selected and applied to the output terminal, the sub-set being determined by the address signals. An obvious reduction in test time can result if all of the retrieved bits, not only the sub-set, were examined for accurate operation. The projected test time would then be derived from the total number of cycles needed to retrieve all the test bits. The assumption that is made is that the sub-arrays are independent. In other words, no cell in the sub-array is affected by any other cell or group of cells in the other sub-arrays.

For the parallel read with expected data (16-times data compression) as shown in FIG. 4, as mentioned earlier, the memory array is arranged in 32 blocks each containing 256 rows and 512 columns of storage cells. Eight blocks each are placed together to form four natural quadrants. In this description, the quadrants are referred to as the left top (LT), right top (RT), left bottom (LB), and right bottom (RB) quadrants as shown in FIG. 2. In addition, to the storage cell array groups, control circuits are coupled to the components of each of the four quadrants.

One data bit is taken from each block. For every data signal retrieval, the data signals from each of the four quadrants are compared. When they are the same, i.e., no error is identified, expected data signal (ED) is used as the output. If an error is indicated, complement of the expected data (i.e., ED_) is used as the output signal.

For a parallel read with expected data (32-times data compression) as shown in FIG. 5, four bits from each block are taken from the top or the bottom half of the chip only. A local compare is performed between the four bits from each block. If any error occurs during this comparison, an error line for that data signal access will be pulled low and ED_ will be used as the output. When no error is indicated, ED is used as the output signal.

For a parallel read with expected data (64-times data compression), four bits from each block are taken from both halves of the chip. A local compare is done between the four bits from each block. If any error occurs during this comparison, an error line for that DATA RETRIEVAL will be pulled low and ED_ will be used as the output. If no error is indicated, ED is used as the output.

Referring to FIG. 4, an embodiment for a 16 bit parallel read procedure, comparator 41 is placed in the right bottom quadrant, comparator 42 is placed in the left top quadrant, and comparator 43 is placed in the left bottom quadrant. Wherever, the comparators are located, three sets of data lines between quadrants are required to provide input signals to the comparators. In addition, two sets of error signal lines as well as lines for the scramble signals must be provided between quadrants to provide the input signals to the signal conditioning circuit 44. The signal conditioning apparatus 44 precharges the error lines, buffers the circuits, and scrambles the signals. If any error in the data line comparison is identified, the error line signal from conditioning circuit 44 is driven to a high condition, while the corresponding output signal from signal conditioning circuit 45 is driven to a low condition. In the expected data comparison circuit, the error signals as well as the complement of the signals from the data lines are applied thereto. The OUTPUT SIGNAL indicates whether an error was detected.

Referring once again to FIG. 5, the testing for 32 times parallel read case is shown. In the preferred embodiment, only the top or bottom half of the chip are activated. 16 LOCAL I/O LINE COMPARISON ERROR SIGNALS_ will be generated. Of these 16 SIGNALS_ 12 are converted into LOCAL I/O LINE COMPARISON ERROR SIGNALS in the signal conditioning circuit 55. The remaining 4 LOCAL I/O LINE COMPARISON ERROR SIGNALS_ are applied to signal conditioning circuit 45. A signal conditioning circuit 55 is located in each quadrant except for the top right quadrant. Signal conditioning circuit 45 is located in the top right quadrant. The signal conditioning circuits 45 and 55 precharge the LOCAL I/O LINE COMPARISON ERROR SIGNALS_ in the HIGH state. When any error is detected in the local comparison, the LOCAL I/O LINE COMPARISON ERROR SIGNALS_ will be driven to the LOW state causing the LOCAL I/O LINE COMPARISON ERROR SIGNALS to be driven to the HIGH state. An output signal is then placed on the output buffer 48. In this configuration, four local line comparison signals are transferred from three quadrants to the right top quadrant. The expected data comparison circuit 46 is placed in the right top quadrant. The expected value comparison circuit is placed in a quadrant different from the selected quadrant so that four data lines must couple the selected quadrant with the quadrant in which the expected data comparison circuit 46 is located. Four data lines will be routed in the quadrant with the expected data comparison circuit for comparison between data lines.

In the 64-times parallel read, the apparatus and method are similar to that in the 32-times parallel read situation except that both halves of the chip are activated simultaneously.

The testing circuits described above can be improved in the following manner. Referring to FIG. 6, the EXPECTED DATA SIGNAL is applied to each data line comparison network 61, 62, 63, and 64. As a result of this comparison, DATA LINE COMPARISON ERROR STATUS SIGNALS_ are applied to signal conditioning circuit 65 and are driven low when the EXPECTED DATA SIGNAL is not found on the data lines, these lines being precharged by signal conditioning circuit 65. If an error is detected, the output signal from the signal conditioning circuitry 65 is driven high. In the expected data comparison circuit 66, the DATA LINE COMPARISON ERROR STATUS SIGNALs, the QUADRANT LOCAL I/O COMPARISON STATUS SIGNALs, and the EXPECTED DATA SIGNAL is compared. A data line comparison circuit (61, 62, 63, or 64) is located in each quadrant. Data lines are not routed between quadrants. The result of the testing is available in a relatively short period of time. The comparison circuits are less complex and a reduced amount of chip area is required. The signal conditioning circuit is placed in a selected quadrant. No scrambling need be performed. Only one line need be routed to the selected quadrants from the other quadrants which results in less parasitic capacitance. Because the parasitic capacitance is less, the precharging circuits can be smaller resulting in lower power consumption. The buffered DATA LINE N signals do not have to be routed within the quadrant. The lesser number of signal lines results in a smaller chip size for the memory.

The apparatus and method for the 32-times parallel read can be improved as shown in FIG. 7. Activating only the top or bottom half of each quadrant, a local compare is performed for four signals from the same block by a signal comparison circuit (71, 72, 73, and 74). The QUADRANT LOCAL I/O COMPARISON STATUS SIGNALS are applied to the expected data comparison circuit 66 along with DATA LINE COMPARISON ERROR STATUS SIGNALs and the EXPECTED DATA SIGNAL and its complement. The expected data comparison circuit 66 provides output signal which determines whether the EXPECTED SIGNALs have been correctly stored and retrieved from storage cells of the memory unit. In this embodiment, one signal comparison circuit (71, 72, 72, 73, and 74) is located in each quadrant. The expected logic comparison circuit 66 will have a less complex implementation and will require less area to implement on the chip upon which the memory unit is fabricated. Only one line is routed between quadrants. The reduced number of conducting paths will result in a reduction of the chip size.

With respect to the 64-times parallel read, the apparatus and the technique are similar to the 32-times parallel read. However, both the top and bottom halves of the chip are activated simultaneously.

Summarizing, the improved implementations of the 16-, 32-, and 64-times parallel read provide fewer conducting paths between various portions of the storage cell array and require relatively simpler logic for implementation of the logic components. These characteristics result in reduced chip size, in reduced parasitic capacitance, and reduced power requirements for activating the chip.

While the invention has been described with particular reference to the preferred embodiment, it will understood by those skilled in the art that various changes may be made and equivalents substituted for elements of the preferred embodiment without departing from the invention. For example, the present invention has been described with particular reference to a storage cell array divided into quadrants. However, the technique for testing a semiconductor memory does not rely on the particular partitioning of the storage cells, the partitioning can involve more or less (than 4) groups of storage cells. In addition, many modifications may be made to adapt a particular situation and material to a teaching of the invention without departing from the essential teachings of the present invention.

As is evident from the foregoing discussion, certain aspects of the invention are not limited to the particular details of examples illustrated, and it is therefore contemplated that other modifications and applications will occur to those skilled in the art. It is accordingly intended that the claims shall cover all the modifications and applications as do not depart from the spirit and scope of the invention.

What is claimed is:

1. Testing apparatus for testing the storage and retrieval of an applied data signal in an array of storage cells in an integrated circuit memory unit, wherein said storage cells are arranged in a plurality of storage cell groups, said apparatus comprising:

a plurality of first comparison circuits, each first comparison circuit associated with a storage cell group, each first comparison circuit receiving a plurality of data signals from addressed storage cells in said associated storage cell group, each first comparison circuit also receiving an applied data signal, each comparison circuit providing a status signal in response to a comparison of said data signals and said applied data signal, and a second comparison circuit associated with a selected storage cell group, said second comparison circuit receiving said status signals and said applied data signal, said comparison circuit providing an error signal when at least one of said retrieved data signal is not said applied data signal.

2. The testing circuit of claim 1 wherein said applied data signal is stored in storage cells applied to said first comparison circuit.

3. The testing apparatus of claim 1 further comprising a signal conditioning circuit, said signal conditioning circuit receiving said status signals and applying said status signals to said second comparison circuit.

4. The testing circuit of claim 1 wherein said storage cells are divided into four quadrants.

5. The testing circuit of claim 1 wherein said memory unit retrieves data signals from 32 storage cells during each data retrieval cycle.

6. Testing apparatus for testing the storage and the retrieval of an expected logic signal in an array of storage cells in a integrated circuit memory unit, wherein said storage cells are arranged in a plurality of storage cell groups, said apparatus comprising:

a plurality of first comparison circuits, each first comparison circuit associated with a storage cell group, each first comparison circuit receiving a plurality of retrieved data signals from said associated storage cell group, each first comparison circuit intercomparing said retrieved data signals, each first comparison circuits providing a group status signal based on said intercomparison; and a second comparison circuit, said second comparison circuit receiving said group status signals and local data line status signals along with an expected data signal, said second comparison circuit providing an error signal when one of said retrieved data signals does not have said expected value.

7. The testing apparatus of claim 6 wherein said expected data signal has been stored in each of the storage cells from which a data signal has been retrieved and applied to said first comparison circuits.

8. The testing apparatus of claim 7 wherein said storage cell array has been partitioned into four quadrant storage cell groups.

9. The testing apparatus of claim 8 wherein signals from 64 storage cells are applied to said first comparison circuits during a memory retrieval cycle.

10. The testing apparatus of claim 9 wherein signals from 128 storage cells are applied to said first comparison circuits during a memory retrieval cycle.

11. A method of using testing apparatus incorporated in an integrated memory circuit, said method comprising the steps of:

dividing an array of storage cells in said memory circuit into a plurality of storage cell groups;

coupling each storage cell group to an associated comparison circuit; storing an applied data signal in each of memory locations to be tested; and performing an initial comparison operation in each comparison circuit with data signals retrieved only from said associated storage cell group.

12. The method of claim 11 wherein said performing step further includes the step of performing an initial comparison operation in each comparison circuit data signals retrieved only from said associated storage cell and said applied data signal.

13. The method of claim 11 further including the steps of:

transferring status signals from said comparison circuits to a second comparison circuit; and performing a final comparison operation in said second comparison circuit with said status signals and said applied data signal.

14. The method of claim 13 wherein said performing said final comparison operation includes the step of performing said final comparison operation with said status signals, said applied data signal, and local data signals.

15. The method of claim 13 further including the step of incorporating said second comparison circuit in association with a selected storage cell group.

16. Testing apparatus for an integrated circuit semiconductor unit, said memory cell including a storage cell array arranged in a plurality of storage cell groups, said testing apparatus comprising:

a plurality of local comparison units, each comparison unit associated with a storage cell group, each comparison unit receiving data signals from a storage cells into which an applied data signal has been stored, said local comparison unit performing a comparison operation involving data signals retrieved only from said associated storage cell group, each local comparison unit generating a status signal based on said comparison operation; and a final comparison unit associated with a one of said storage cell groups, said final comparison unit generating an error signal in response to a comparison operation involving said status signals and said applied data signal.

17. The testing apparatus of claim 16 wherein said local comparison units have said applied data signal applied thereto, wherein said expected data signal is included in said local signal operation.

18. The testing apparatus of claim 16 wherein said storage cell array is divided into four quadrant storage cell arrays.

19. The testing apparatus of claim 18 wherein 32 data signals from said storage cell array are tested simultaneously.

20. The testing apparatus of claim 18 wherein said storage cell groups are divided in half, wherein 64 data signals from one half of the storage cell array can be simultaneously tested.

21. In a semiconductor memory unit in which the memory cell array is divided into a plurality of memory cell groups, said semiconductor memory unit including testing apparatus, said testing apparatus comparing data signals retrieved from storage cells in a plurality of storage cell groups, said storage cells having an applied data signal stored therein, at least part of said testing apparatus performing comparison operations associated with each storage cell group, an improved method of testing stored data signals, said improvement comprising the steps of:

performing a comparison of data signals retrieved only from a storage cell group with an applied data signal in a first comparison unit associated with said storage cell group from which said data signals were retrieved;

transmitting a status signal from at least one first comparison unit associated with a a first storage cell group to a second comparison unit; and performing a comparison operation in said second comparison unit using said status signals and said applied data signal.

22. The method of claim 21 wherein the step of performing a comparison in said second comparison unit also uses local status from a storage cell group associated with said second comparison unit.

23. The method of claim 22 wherein the step of performing a comparison step includes the step of testing one half of said data signals retrieved from said storage cell array in a memory retrieval cycle.

24. The method of claim 21 wherein said transmitting step included the step applying said status signals to a signal conditioning circuit before application to said second comparison unit.

25. The method of claim 21 wherein an output signal of said second comparison unit indicates when an error in said retrieved data signals has been identified.

* * * * *